United States Patent
Gravel

(10) Patent No.: US 11,018,694 B2
(45) Date of Patent: May 25, 2021

(54) FAST CYCLIC REDUNDANCY CHECK CODE GENERATION

(71) Applicant: Hewlett Packard Enterprise Development LP, Houston, TX (US)

(72) Inventor: Mark Allen Gravel, Roseville, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 16 days.

(21) Appl. No.: 16/436,101

(22) Filed: Jun. 10, 2019

(65) Prior Publication Data

US 2020/0389183 A1 Dec. 10, 2020

(51) Int. Cl.
*H03M 13/09* (2006.01)
*H03M 13/15* (2006.01)

(52) U.S. Cl.
CPC ....... *H03M 13/091* (2013.01); *H03M 13/157* (2013.01)

(58) Field of Classification Search
None
See application file for complete search history.

(56) References Cited

U.S. PATENT DOCUMENTS

| | | | |
|---|---|---|---|
| 6,904,558 B2 | 6/2005 | Cavanna et al. | |
| 7,185,266 B2 | 2/2007 | Blightman et al. | |
| 7,627,802 B2 | 12/2009 | Pisek et al. | |
| 7,631,251 B2 * | 12/2009 | Bower | H03M 13/09 714/758 |
| 8,468,439 B2 | 6/2013 | Kirkpatrick | |
| 8,543,888 B2 * | 9/2013 | Bommena | H03M 13/6516 714/758 |
| 8,612,842 B2 * | 12/2013 | Gammel | H03M 13/091 714/807 |
| 9,154,163 B2 * | 10/2015 | Engberg | H03M 13/091 |
| 10,481,971 B2 * | 11/2019 | Shinbashi | G06F 11/10 |
| 2004/0098635 A1 * | 5/2004 | Cho | G06F 13/423 713/600 |

OTHER PUBLICATIONS

AT&T Bell Laboratories, Error Control Aspects of High Speed Networks, 1992, pp. 1-10, Retrieved from the Internet on Feb. 4, 2019 from URL: <computer.org/csdl/proceedings/infcom/1992/0602/00/00263560.pdf>.

(Continued)

*Primary Examiner* — Phung M Chung
(74) *Attorney, Agent, or Firm* — Sheppard Mullin Richter & Hampton LLP

(57) ABSTRACT

Systems and methods are provided for fast cyclic redundancy check code generation. For example, a method includes representing the sequence of bits as a polynomial over a Galois field base 2; partitioning the polynomial into a plurality of partial polynomials, wherein the polynomial equals the sum of the partial polynomials; concurrently generating a respective partial CRC code for each of the partial polynomials; weighting each partial CRC code according to a position of the respective partial polynomial in the polynomial; and summing the weighted partial CRC codes.

20 Claims, 7 Drawing Sheets

(56) References Cited

OTHER PUBLICATIONS

Ewing, Gregory: Reverse-engineering a CRC Algorithm, Mar. 2010, pp. 1-8, Retrieved from the Internet on Feb. 4, 2019 from URL: <cosc.canterbury.ac.nz/greg.ewing/essays/CRC-Reverse-Engineering.html >.
Harika, P. et al.; FPGA Based High Speed Parallel Cyclic Redundancy Check, 2013, pp. 1-8, Retrieved from the Internet on Feb. 4, 2019 from URL: <pdfs.semanticscholar.org/b784/bb0a0ac0c1c0408955987230e5f2258f8eb5.pdf>.
Priya, V.P.: Design of Parallel CRC Generation for High Speed Application, Aug. 2017, pp. 1-4, Retrieved from the Internet on Feb. 4, 2019 from URL: <ijesc org/upload/776eba20eba20e19f5e644bffb0921c3aa97 Design%20of%20Parallel%20CRC%20generation%20for%20High%20Speed%20Application.pdf >.
Walma, M.; Pipelined Cyclic Redundancy Check (CRC) Calculation, Aug. 13-16, 2007, pp. 1-2, Retrieved from the Internet on Feb. 4, 2019 from URL: <ieeexplore.ieee.org/document/4317846 >.

\* cited by examiner

FAST CYCLIC REDUNDANCY CHECK CODE GENERATION

DESCRIPTION OF RELATED ART

The disclosed technology relates generally to data communication networks, and more particularly some embodiments relate to checking for errors in data in such networks.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

In systems such as data communication networks, data may become corrupted during transmission, storage, and the like. This data may include messages exchanged between network devices, as well as internal values used within the network devices, for example including internal parameters employed by network switches, routers, and the like. One common technique for detecting corrupted data is the use of cyclic redundancy check (CRC) codes. When data is transmitted, stored, or the like, a first CRC code is calculated for the data. Later, when the data is received, retrieved, or the like, a second CRC code is calculated for the data. If the first and second CRC codes do not match, the data is considered corrupt.

In some situations, CRC code generation is implemented using linear feedback shift registers (LFSR). These implementations suffer from several limitations. High-speed network switches and routers in data communication networks may operate in multiple terabits per second, and employ very wide internal interfaces that run a very high clock rates. But LFSR implementations limit internal interface width and/or clock rates because they scale with interface width. Furthermore, LFSR implementations maintain state representing the CRC code of all previously processed bytes of a message. Therefore, when only a few bytes of the message is modified, it is not possible to patch the CRC code without regenerating a new CRC code over the entire message. This regeneration process consumes considerable internal processing bandwidth.

Embodiments of the disclosed technology provide CRC code generation and checking implementations using superposition principles. These embodiments allows very-large-scale integrated circuit (VLSI) designers to overcome the problems described above regarding LFSR implementations. These embodiments allow patching segments of a message, and CRC code patching without regenerating the CRC code for the entire message. These embodiments also provide a fixed logic tree depth regardless of internal data path width, and therefore support wider data buses.

The disclosed technology better supports high-speed network switches and routers, which may rely on wide internal data paths to achieve multiple terabit-per-second speeds, and provides the ability to partially modify messages and patch the CRC rather than having to regenerate the CRC over the entire message. Moreover, the disclosed embodiments provide functions that support adding pipeline stages between each function, thereby reducing the number of logic levels between pipeline stages, further improving performance.

Figure 1:
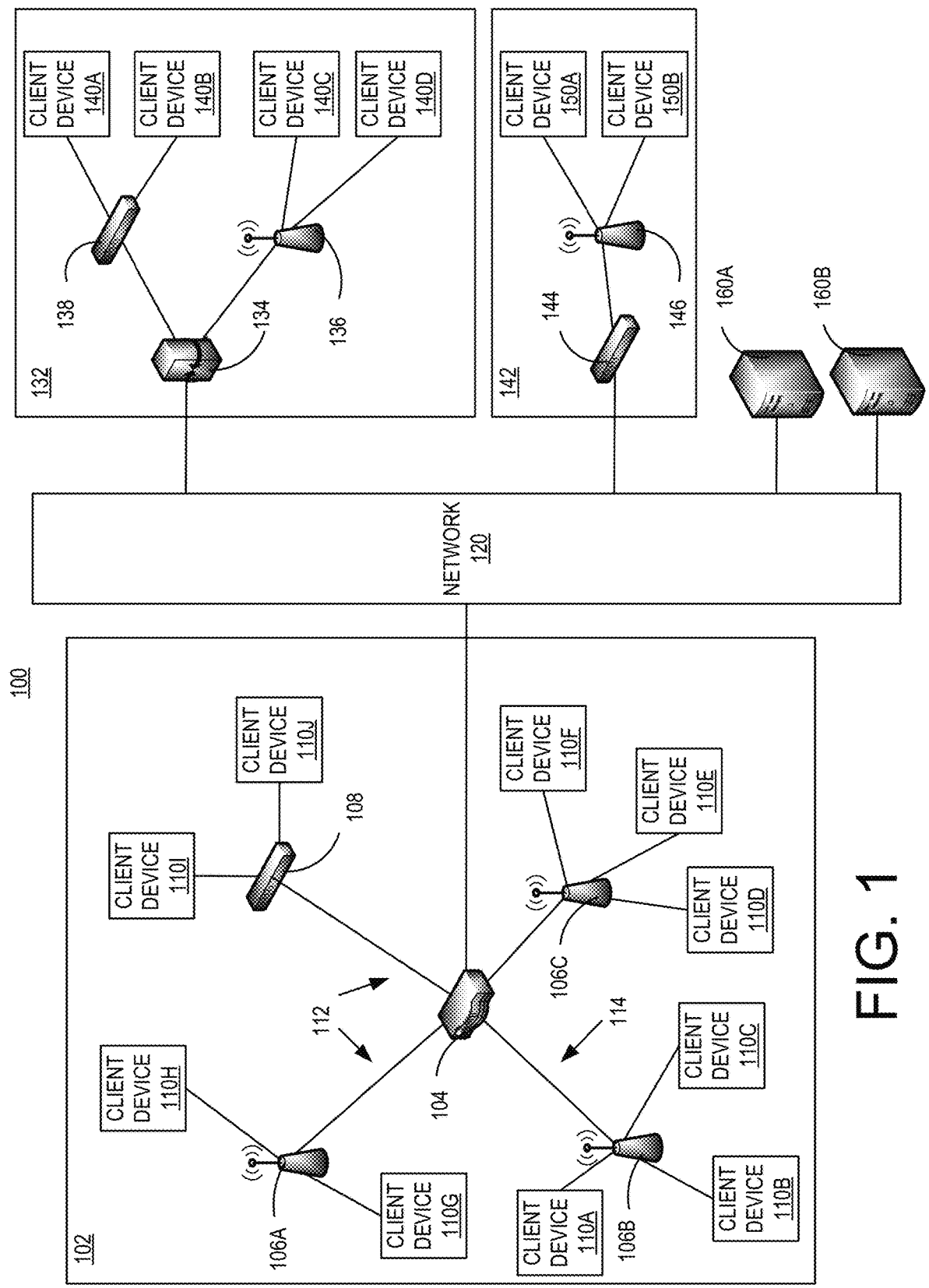
FIG. 1 illustrates one example of a network configuration that may be implemented for an organization, such as a business, educational institution, governmental entity, healthcare facility or other organization.

Before describing embodiments of the disclosed systems and methods in detail, it is useful to describe an example network installation with which these systems and methods might be implemented in various applications. FIG. 1 illustrates one example of a network configuration 100 that may be implemented for an organization, such as a business, educational institution, governmental entity, healthcare facility or other organization. This diagram illustrates an example of a configuration implemented with an organization having multiple users (or at least multiple client devices 110) and possibly multiple physical or geographical sites 102, 132, 142. The network configuration 100 may include a primary site 102 in communication with a network 120. The network configuration 100 may also include one or more remote sites 132, 142, that are in communication with the network 120.

The primary site 102 may include a primary network (not shown), which can be, for example, an office network, home network or other network installation. The primary site 102 network may be a private network, such as a network that may include security and access controls to restrict access to authorized users of the private network. Authorized users may include, for example, employees of a company at primary site 102, residents of a house, customers at a business, and so on.

In the illustrated example, the primary site 102 includes a controller 104 in communication with the network 120. The controller 104 may provide communication with the network 120 for the primary site 102, though it may not be the only point of communication with the network 120 for the primary site 102. A single controller 104 is illustrated, though the primary site may include multiple controllers and/or multiple communication points with network 120. In some embodiments, the controller 104 communicates with the network 120 through a router (not illustrated). In other embodiments, the controller 104 provides router functionality to the devices in the primary site 102.

A controller 104 may be operable to configure and manage network devices, such as at the primary site 102, and may also manage network devices at the remote sites 132, 142. The controller 104 may be operable to configure and/or manage switches, routers, access points, and/or client devices connected to a network. The controller 104 may itself be, or provide the functionality of, an access point.

The controller 104 may be in communication with one or more switches 108 and/or wireless Access Points (Aps) 106a-c. Switches 108 and wireless APs 106a-c provide network connectivity to various client devices 110a-j. Using a connection to a switch 108 or AP 106a-c, a client device 110a-j may access network resources, including other devices on the (primary site 102) network and the network 120.

Examples of client devices may include: desktop computers, laptop computers, servers, web servers, authentication servers, authentication-authorization-accounting (AM) servers, Domain Name System (DNS) servers, Dynamic Host Configuration Protocol (DHCP) servers, Internet Protocol (IP) servers, Virtual Private Network (VPN) servers, network policy servers, mainframes, tablet computers, e-readers, netbook computers, televisions and similar monitors (e.g., smart TVs), content receivers, set-top boxes, personal digital assistants (PDAs), mobile phones, smart phones, smart terminals, dumb terminals, virtual terminals, video game consoles, virtual assistants, Internet of Things (IOT) devices, and the like.

Within the primary site 102, a switch 108 is included as one example of a point of access to the network established in primary site 102 for wired client devices 110i-j. Client devices 110i-j may connect to the switch 108 and through the switch 108, may be able to access other devices within the network configuration 100. The client devices 110i-j may also be able to access the network 120, through the switch 108. The client devices 110i-j may communicate with the switch 108 over a wired 112 connection. In the illustrated example, the switch 108 communicates with the controller 104 over a wired 112 connection, though this connection may also be wireless.

Wireless APs 106a-c are included as another example of a point of access to the network established in primary site 102 for client devices 110a-h. Each of APs 106a-c may be a combination of hardware, software, and/or firmware that is configured to provide wireless network connectivity to wireless client devices 110a-h. In the illustrated example, APs 106a-c can be managed and configured by the controller 104. APs 106a-c communicate with the controller 104 and the network over connections 112, which may be either wired or wireless interfaces.

The network configuration 100 may include one or more remote sites 132. A remote site 132 may be located in a different physical or geographical location from the primary site 102. In some cases, the remote site 132 may be in the same geographical location, or possibly the same building, as the primary site 102, but lacks a direct connection to the network located within the primary site 102. Instead, remote site 132 may utilize a connection over a different network, e.g., network 120. A remote site 132 such as the one illustrated in FIG. 1 may be, for example, a satellite office, another floor or suite in a building, and so on. The remote site 132 may include a gateway device 134 for communicating with the network 120. A gateway device 134 may be a router, a digital-to-analog modem, a cable modem, a Digital Subscriber Line (DSL) modem, or some other network device configured to communicate to the network 120. The remote site 132 may also include a switch 138 and/or AP 136 in communication with the gateway device 134 over either wired or wireless connections. The switch 138 and AP 136 provide connectivity to the network for various client devices 140a-d.

In various embodiments, the remote site 132 may be in direct communication with primary site 102, such that client devices 140a-d at the remote site 132 access the network resources at the primary site 102 as if these clients devices 140a-d were located at the primary site 102. In such embodiments, the remote site 132 is managed by the controller 104 at the primary site 102, and the controller 104 provides the necessary connectivity, security, and accessibility that enable the remote site 132's communication with the primary site 102. Once connected to the primary site 102, the remote site 132 may function as a part of a private network provided by the primary site 102.

In various embodiments, the network configuration 100 may include one or more smaller remote sites 142, comprising only a gateway device 144 for communicating with the network 120 and a wireless AP 146, by which various client devices 150a-b access the network 120. Such a remote site 142 may represent, for example, an individual employee's home or a temporary remote office. The remote site 142 may also be in communication with the primary site 102, such that the client devices 150a-b at remote site 142 access network resources at the primary site 102 as if these client devices 150a-b were located at the primary site 102. The remote site 142 may be managed by the controller 104 at the primary site 102 to make this transparency possible. Once connected to the primary site 102, the remote site 142 may function as a part of a private network provided by the primary site 102.

The network 120 may be a public or private network, such as the Internet, or other communication network to allow connectivity among the various sites 102, 130 to 142 as well as access to servers 160a-b. The network 120 may include third-party telecommunication lines, such as phone lines, broadcast coaxial cable, fiber optic cables, satellite communications, cellular communications, and the like. The network 120 may include any number of intermediate network devices, such as switches, routers, gateways, servers, and/or controllers, which are not directly part of the network configuration 100 but that facilitate communication between the various parts of the network configuration 100, and between the network configuration 100 and other network-connected entities. The network 120 may include various content servers 160a-b. Content servers 160a-b may include various providers of multimedia downloadable and/or streaming content, including audio, video, graphical, and/or text content, or any combination thereof. Examples of content servers 160a-b include, for example, web servers, streaming radio and video providers, and cable and satellite television providers. The client devices 110a-j, 140a-d, 150a-b may request and access the multimedia content provided by the content servers 160a-b.

Now embodiments of the disclosed technology are described in detail. Some of the discussion and examples that follow employ the IEEE-CRC32 polynomial, which is often used in high-speed Ethernet switches and routers. However, the disclosed technology is not limited to that polynomial, and therefore may be employed with other CRC polynomials.

The disclosed technology makes use of the superposition principle. The superposition principle, also known as the superposition property, holds that for all linear systems, the response caused by two or more stimuli is the sum of the responses that would have been caused by each stimulus individually. For example, if input A produces response X and input B produces response Y, then input A+B produces response X+Y. This property allows a string of bits such as a message, in a polynomial representation, to be broken into smaller, more manageable partial messages. A partial CRC code may be generated for each partial message. The partial CRC codes may be summed to provide a final CRC code.

Owing to the superposition principle, the final CRC code is the same as a CRC code generated over the entire message. This technique may be used with any CRC generator polynomial.

The CRC calculation is based on polynomial division over Galois field base 2, which constrains polynomial coefficients to a value of 1 or 0. A transmitted message protected by the CRC code is represented by the polynomial T(x). The CRC code is the remainder, R(x), derived from dividing the original massage, M(x), by the CRC Polynomial, G(x).

$$T(x)=M(x)*X^r+R(x)$$

$$R(x)=M(x)*X^r \bmod G(x)$$

Figure 2:
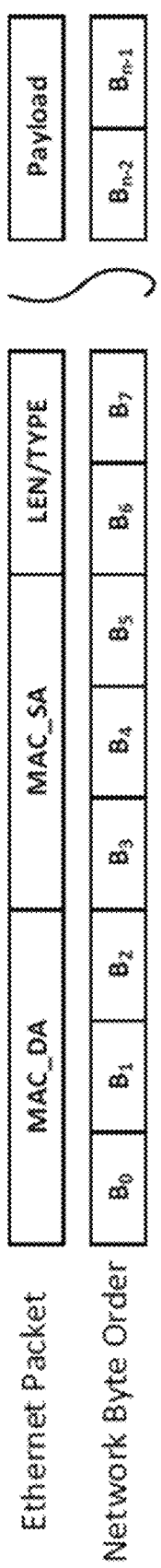
FIG. 2 illustrates the relationship between an Ethernet data packet in network byte order and the message polynomial terms and coefficients.

FIG. 2 illustrates the relationship between an Ethernet data packet in network byte order and the message polynomial terms and coefficients. An Ethernet packet is represented in polynomial form as a sequence of n bits. Each bit, one or zero, becomes the coefficient α to the term relative to the bit position in the packet. The message polynomial M(x) is divided by CRC polynomial G(x) to produce the CRC polynomial remainder R(x), which is appended to the message M(x).

The message, M(x), can be broken into k partial messages, represented by k partial polynomials.

$$P_0(x) = a_7 \times X^7 + a_6 \times X^6 + a_5 \times X^5 +$$
$$a_4 \times X^4 + a_3 \times X^3 + a_2 \times X^2 + a_1 \times X^1 + a_0 \times X^0$$

$$P_1(x) = a_{15} \times X^{15} + a_{14} \times X^{14} + a_{13} \times X^{13} + a_{12} \times X^{12} +$$
$$a_{11} \times X^{11} + a_{10} \times X^{10} + a_9 \times X^9 + a_8 \times X^8$$

...

$$P_k(x) = a_{8k+7} \times X^{8k+7} + a_{8k+6} \times X^{8k+6} + a_{8k+5} \times X^{8k+5} + a_{8k+4} \times X^{8k+4} +$$
$$a_{8k+3} \times X^{8k+3} + a_{8k+2} X^{8k+2} + a_{8k+1} \times X^{8k+1} + a_{8k} \times X^{8k}$$

These smaller weighed polynomials can be summed to represent M(x).

$$M(x)=P_k(x)+P_{k-1}(x)+ \ldots +P_3(x)+P_2(x)+P_1(x)+P_0(x)$$

This notation will be used below to describe calculating the message CRC over the partial messages.

The superposition principle states that for all linear systems, the system response can be represented as a sum of its parts. An example of the superposition principle is the Fourier series. In the context of the CRC calculation, the superposition principle holds that a CRC result is the sum of partial CRC results.

According to embodiments of the disclosed technology, a message polynomial M(x) is decomposed into a set of partial polynomials P(x). A partial CRC code is generated for each of the partial polynomials P(x). The partial CRC codes are added over GF(2). Addition over GF(2) may be implemented as a simple XOR operation using logic gates.

The message polynomial M(x) may be represented as the sum of multiple partial polynomials. In this example, each partial polynomial represents a byte of data, and so has eight terms.

$$M_k(x) = P_k(x) + 0 + \ldots + 0 + 0 + 0 + 0$$

$$M_{k-1}(x) = 0 + P_{k-1}(x) + \ldots + 0 + 0 + 0 + 0$$

...

$$M_3(x) = 0 + 0 + L + P_3(x) + 0 + 0 + 0$$

$$M_2(x) = 0 + 0 + L + 0 + P_2(x) + 0 + 0$$

$$M_1(x) = 0 + 0 + L + 0 + 0 + P_1(x) + 0$$

$$M_0(x) = 0 + 0 + L + 0 + 0 + 0 + P_0(x)$$

Note that the message polynomial M(x) may be expressed as a sum of the partial polynomials.

$$M(x) = \sum_0^k M_i(x)$$

Therefore, the message CRC is the sum of the partial CRC codes of the partial polynomials.

$$R(x) = \sum_0^k [M_i(x) \cdot X^r \bmod G(x)]$$

$$R(x) = R_k(x) + R_{k-1}(x) + L + R_3(x) + R_2(x) + R_1(x) + R_0(x)$$

Therefore the message CRC code may be generated by summing the partial CRC codes generated from the decomposition of the original message.

Figure 3:
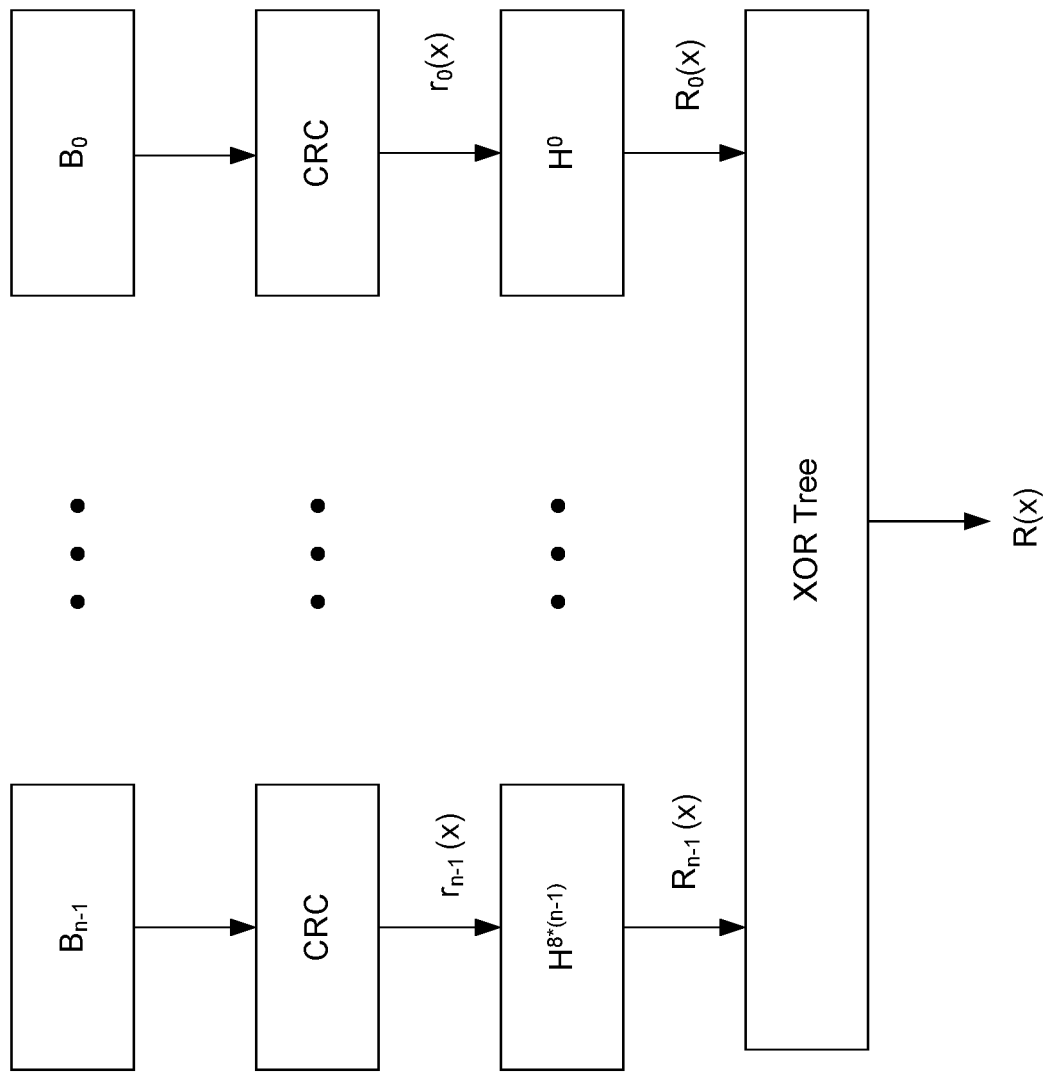
FIG. 3 illustrates an embodiment of a CRC generator using the superposition principle according to one embodiment of the disclosed technology.

FIG. 3 illustrates an embodiment of a CRC generator using the superposition principle according to one embodiment of the disclosed technology. This technique supports partial messages of any size, and with any arbitrary CRC generator polynomial. The CRC code of each partial message in this embodiment may be calculated piecewise over 8-bit-wide segments of the partial message. However, any integer multiple of 8 bits may be processed in a similar manner.

Referring to FIG. 3, n partial messages are shown, at $B_{n-1}$-$B_0$. Each partial message may be represented in polynomial format. The example of FIG. 3 uses a message size of n partial messages.

A partial CRC code is generated for each partial message, as shown at CRC. The partial CRC codes are shown in FIG. 3 as $r_{n-1}(x)$-$r_0(x)$. A CRC generator polynomial of any size may be used. For example, the IEEE-CRC32 generator polynomial may be used. Generation of the IEEE_CRC32 CRC is purely combinatorial, and may be implemented as a simple XOR tree.

Each partial CRC code is then weighted for its numeric position in the message, as shown at $H^{8*(n-1)}$-$H^0$. The weighting function is mathematically equivalent to appending trailing zeros to piecewise polynomials, and may be implemented as a transform referred to herein as an H-transform, described below. The weighted partial CRC codes are shown in FIG. 3 as $R_{n-1}(x)$-$R_0(x)$. The n−1 partial CRC results may be summed over GF(2) using a simple XOR tree to produce a partial CRC code for the partial message. The partial CRC code is shown in FIG. 3 as R(x).

From FIG. 3 it is clear that increasing the number of bytes processed in parallel does not significantly change the worst case logic path. The partial CRC codes are generated concurrently.

Figure 4:
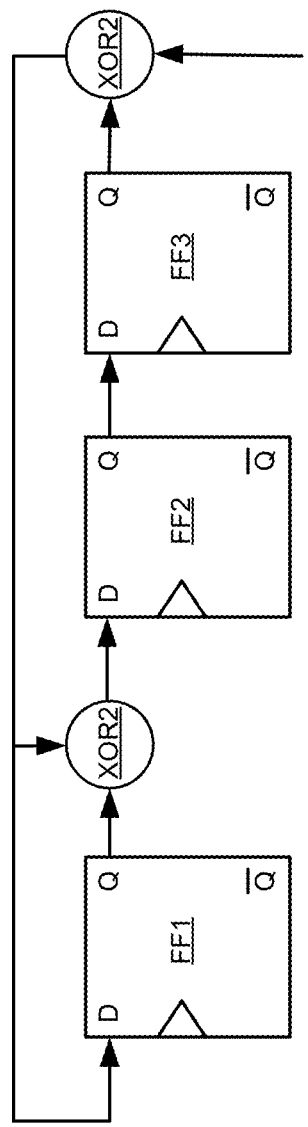
FIG. 4 illustrates a technique for generating an H transform matrix for a generator polynomial according to one embodiment.

The H transform is an r×r binary transform matrix, where r is the power of the generator polynomial. An element $H_{i,j}=1$ if and only if register bit J feeds register bit I in the LSFR implementation. FIG. 4 illustrates a technique using logic gates to generate an H transform matrix for a generator polynomial $G(x)=x^3+x+1$, where r=3, according to one embodiment. The logic gates may be implemented in circuitry. Referring to FIG. 4, the technique may be implemented using three D-type flip-flops FF1, FF2, and FF3, and two exclusive-or gates XOR1, XOR2. In the example of FIG. 4, gate XOR2 receives the Q output of flip-flop FF3 and the coefficients α of the message polynomial M(x), with the leading bit first. The D input of flip-flop FF3 receives the Q output of the flip-flop FF2. The D input of the pipe and flop FF2 receives the output of the gate XOR1. The gate XOR1 receives the Q output of the flip-flop FF1 and the output of the gate XOR2. The D input of the flip-flop FF1 receives the output of the gate XOR2.

Using standard matrix notation, the H transform illustrated in FIG. 4 is given by $$H^1 = \begin{vmatrix} 0 & 0 & 1 \\ 1 & 0 & 1 \\ 0 & 1 & 0 \end{vmatrix}$$

Subsequent H transform matrices may be generated by multiplying H. For example, $H^2=H^1*H^1$, $H^4=H^2*H^2$, and so on. The H transform matrix $H^0$ is simply the identity matrix.

$$H^0 = \begin{vmatrix} 1 & 0 & 0 \\ 0 & 1 & 0 \\ 0 & 0 & 1 \end{vmatrix}$$

Messages are rarely comprised of an integer number of partial messages. Therefore a message polynomial M(x) is rarely comprised of an integer number of partial polynomials, P(x). In some embodiments, leading or trailing bytes may be removed from a partial message, typically the first or last partial message, respectively. In some embodiments, superposition principles may be used to remove leading or trailing bytes from a partial message, as described below.

In some embodiments, leading bytes may be removed by removing the one or more partial polynomials with the most weight, also referred to herein as "leading partial polynomials", thereby excluding the contribution of those partial polynomials. For example, consider removing leading bytes $P_k(x)$ and $P_{k-1}(x)$, illustrated below, from the CRC calculation.

$M_k(x)=P_k(x)+0+\ldots+0+0+0+0$ $M_{k-1}(x)=0+P_{k-1}(x)+\ldots+0+0+0+0$ $M_3(x)=0+0+L+P_3(x)+0+0+0$ $M_2(x)=0+0+L+0+P_2(x)+0+0$ $M_1(x)=0+0+L+0+0+P_1(x)+0$ $M_0(x)=0+0+L+0+0+0+P_0(x)$ The CRC contribution from bytes $P_k(x)$ and $P_{k-1}(x)$ in the CRC code may be removed by zeroing the corresponding partial CRC results from each piecewise polynomial.

$R(x)=R_k(0)+R_{k-1}(0)+L+R_3(x)+R_2(x)+R_1(x)+R_0(x)$

Summing zeros over GF(2) does not change the result.

This operation may be implemented by driving zero on those leading bytes feeding the logic illustrated in FIG. 3. Since the CRC function is purely combinatorial with no initial state, the output for a zero input is also zero. The H-Transform is a simple multiplication function on zero, so the result is zero, and the XOR of all zeros does not add any contribution to the final CRC result.

In some embodiments, trailing bytes of partial messages may be removed by excluding the contribution of their partial polynomials, also referred to herein as "trailing partial polynomials." Consider a message M(x) with trailing zeros in the partial polynomial format.

$M_0(x)=P_k(x)+P_{k-1}(x)+\ldots+P_3(x)+P_2(x)+0+0$

Partial polynomials $P_1(x)$ and $P_0(x)$ together represent 16 trailing zeros (coefficients) of the message. The trailing zeros may be removed from the message M(x) by dividing the message by X raised to the number of zeros to be removed, $X^{16}$ in this example. Partial polynomials $P_1(0)$ and $P_0(0)$ each contain eight zero coefficients each.

Where the H transform is the mathematical equivalent of adding trailing zeros to a partial CRC result, the G transform is the mathematical equivalent to removing trailing zeros on a partial CRC result. The G matrix and the H matrix are mathematic inverses.

Where multiplying a CRC result by $H^{16}$ is equivalent to adding 16 trailing zeros, multiplying a CRC result by $G^{16}$ is equivalent to removing 16 trailing zeros. Given that implementations are generally limited to a finite partial message length, it is possible to generate all possible G matrix transforms needed to remove a determined number of trailing zeros.

Figure 5:
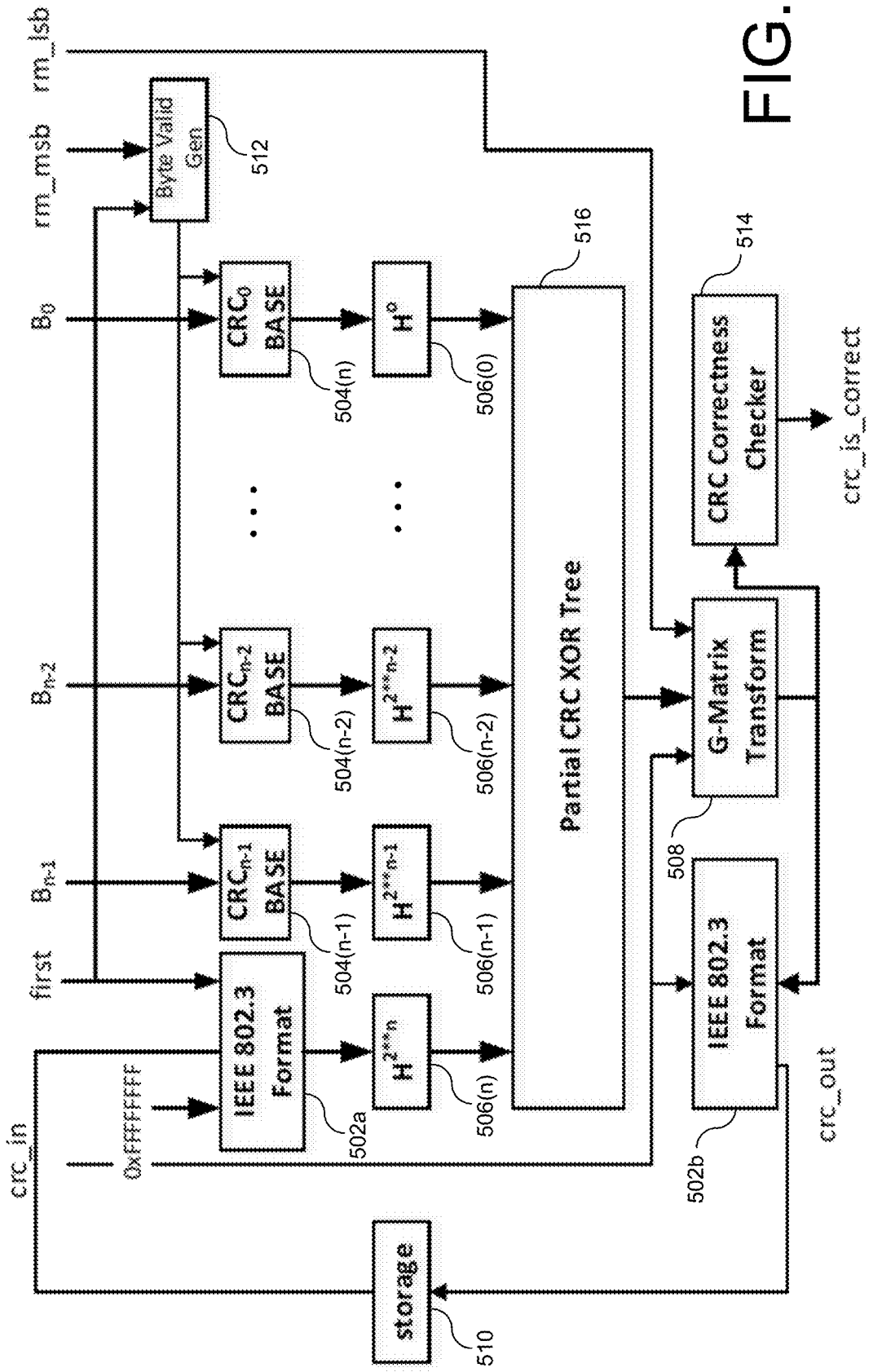
FIG. 5 illustrates a CRC code generator and checker according to one embodiment of the disclosed technology.

FIG. 5 illustrates a CRC code generator and checker according to one embodiment of the disclosed technology. This CRC code generator and checker supports the IEEE_CRC32 polynomial and CRC format. Similar embodiments may be employed to support other CRC polynomials. The CRC code generator may be implemented using logic gates. The logic gates may be implemented as circuitry.

The embodiment of FIG. 5 may use superposition principles to generate and check CRC codes on both 160-byte and 256-byte internal data paths timed to run at 1 Gbps clock periods, and may support overall message sizes up to 16K bytes using one or more 160-byte and 256-byte partial messages. This embodiment supports removing both leading and trailing partial message bytes.

Referring to FIG. 5, the system may include two IEEE 802.3 format translation circuits 502a,b. The IEEE 802.3 standard requires that a frame CRC code be appended to the packet starting with the most significant bit. The internal representation of the CRC code is in simple bit vector format—crc[31:0], and may be transformed into the IEEE format as follows:

IEEE_CRC32[31:0]=~{crc[24:32], crc[12:23],crc[8:11], crc[0:7]}

To mimic the initial CRC state of an LFSR embodiment, the CRC input value of the first partial message may be 0xFFFF_FFFF. The format translation blocks 502a,b convert between matrix and IEEE 802.3 formats and the internal format used the system. In embodiments using other formats, the IEEE 802.3 format translation circuits 502 may be omitted.

The system may include n CRC base generator circuits 504(0) through 504(n−1) to generate partial CRC codes. Each CRC base generator circuits 504 calculates a piecewise CRC code at weight zero for each byte of the partial message. At most, the CRC Base Generator adds five 2-input XOR logic levels.

The system may include n+1 H-transform circuits 506(0) through 506(n) to shift the partial CRC codes. Each H-transform circuit 506 weights each partial CRC code for its position in the partial message. The H-Matrix may be a constant function that selects one of 256 weights. The weights may be pre-calculated using scripts. This technique is easily extended to any arbitrary number of weights.

The system includes an XOR tree 516 to sum the shifted partial CRC codes. The XOR tree 516 may combine all the weighed partial CRC codes, along with the weighed previous CRC, into the next CRC value, which may represent the final CRC code or the intermediate LFSR state of a multi-word packet. The results may be stored in storage 510. For an overall supported message size of 16K bytes, an intermediate CRC code (crc_out) may be stored and passed to the logic as crc_in with the next partial message. On the last partial message, crc_out, may be appended to the entire message for transmission. The formatting logic 502b ensure that the CRC code is the format required for IEEE_CRC32.

The system may include a G-matrix transform circuit 508 to remove trailing bytes from the last partial message. Since any number of arbitrary bytes can be removed from a partial word, this circuit may consume a measurable amount of the timing budget, which is estimated to be at most ten 2-input XOR logic levels or O(log 2(64)) complexity.

The number of logic levels may be reduced through one or more techniques. Trailing byte removal may be quantized over larger quantities, for example such as 4-byte or 32-byte groups. The number of bytes that can be removed from the last word may be bounded. Both options are available via commercial compile optimizations and tying rm_lsb upper or lower bits to constant values.

The system may include a CRC code correctness checker circuit 514. The CRC code correctness checker circuit 514 validates the CRC code. In the example of the IEEE 802.3 CRC polynomial, correctness means that the final CRC code calculation over the entire message (including all partial messages) and message CRC code equals the predetermined termination value of 32'hC7_04_DD_7B. A variable crc_is_correct may be asserted during processing the last partial message. Embodiments using different CRC polynomials may employ different termination values.

The system may include a byte valid generator circuit 512. The byte valid generator circuit 512 may be used to determine which leading bytes of a partial message will be removed from the CRC calculation. This embodiment may remove leading bytes in the first partial message only. Leading bytes may be truncated by driving the partial CRC code result to all 0's, which does not alter the XOR tree results for partial CRCs on the other bytes.

Figure 6:
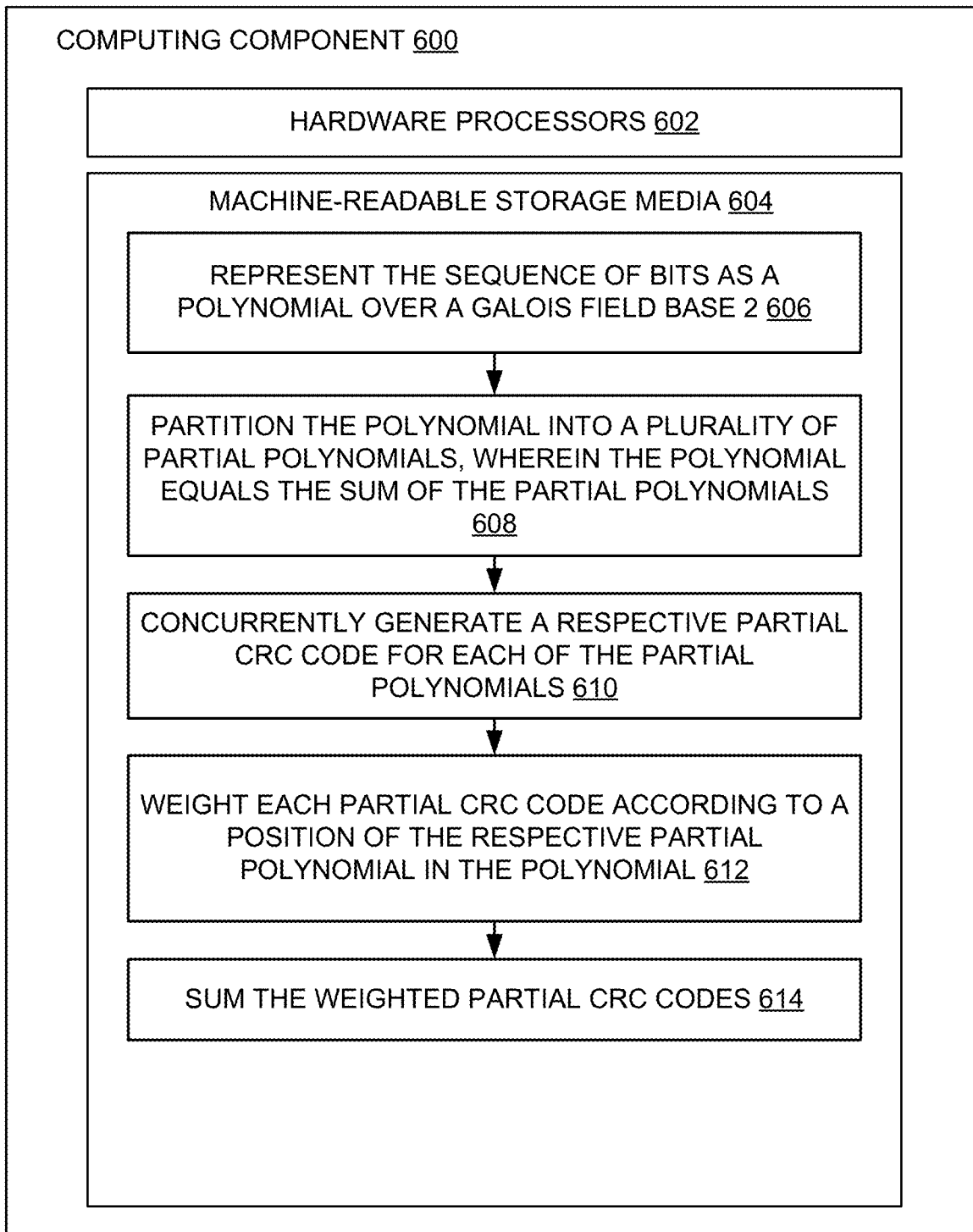
FIG. 6 is a block diagram of an example computing component or device for generating a CRC code for a sequence of bits according to embodiments of the disclosed technology.

FIG. 6 is a block diagram of an example computing component or device 600 for generating a CRC code for a sequence of bits according to embodiments of the disclosed technology. Computing component 600 may be, for example, a server computer, a controller, or any other similar computing component capable of processing data. In the example implementation of FIG. 6, the computing component 600 includes a hardware processor 602, and machine-readable storage medium 604.

Hardware processor 602 may be one or more central processing units (CPUs), semiconductor-based microprocessors, and/or other hardware devices suitable for retrieval and execution of instructions stored in machine-readable storage medium, 604. Hardware processor 602 may fetch, decode, and execute instructions, such as instructions 606-614, to control processes or operations for doing stuff. As an alternative or in addition to retrieving and executing instructions, hardware processor 602 may include one or more electronic circuits that include electronic components for performing the functionality of one or more instructions 606-614, such as a field programmable gate array (FPGA), application specific integrated circuit (ASIC), or other electronic circuits.

A machine-readable storage medium, such as machine-readable storage medium 604, may be any electronic, magnetic, optical, or other physical storage device that contains or stores executable instructions. Thus, machine-readable storage medium 604 may be, for example, Random Access Memory (RAM), non-volatile RAM (NVRAM), an Electrically Erasable Programmable Read-Only Memory (EEPROM), a storage device, an optical disc, and the like. In some embodiments, machine-readable storage medium 604 may be a non-transitory storage medium, where the term "non-transitory" does not encompass transitory propagating signals. As described in detail below, machine-readable storage medium 604 may be encoded with executable instructions, for example, instructions 606-614.

Hardware processor 602 may execute instruction 606 to represent the sequence of bits as a polynomial over a Galois field base 2. Hardware processor 602 may execute instruction 608 to partition the polynomial into a plurality of partial polynomials, wherein the polynomial equals the sum of the partial polynomials. For example, this representation and partition may be as discussed above regarding FIG. 2.

Hardware processor 602 may execute instruction 610 to concurrently generate a respective partial CRC code for each of the partial polynomials. That is, the partial CRC codes are generated in parallel at substantially the same time. Referring to FIG. 5, generating the partial CRC codes may be performed by the CRC base circuits 504.

Referring again to FIG. 6, hardware processor 602 may execute instruction 612 to weight each partial CRC code according to a position of the respective partial polynomial in the polynomial. Referring to FIG. 5, the partial CRC code may be weighted by the H-transform circuits, for example as described above.

Hardware processor 602 may execute instruction 614 to sum the weighted partial CRC codes. Referring to FIG. 5, the sum may be obtained by the XOR tree 516, for example as described above.

Figure 7:
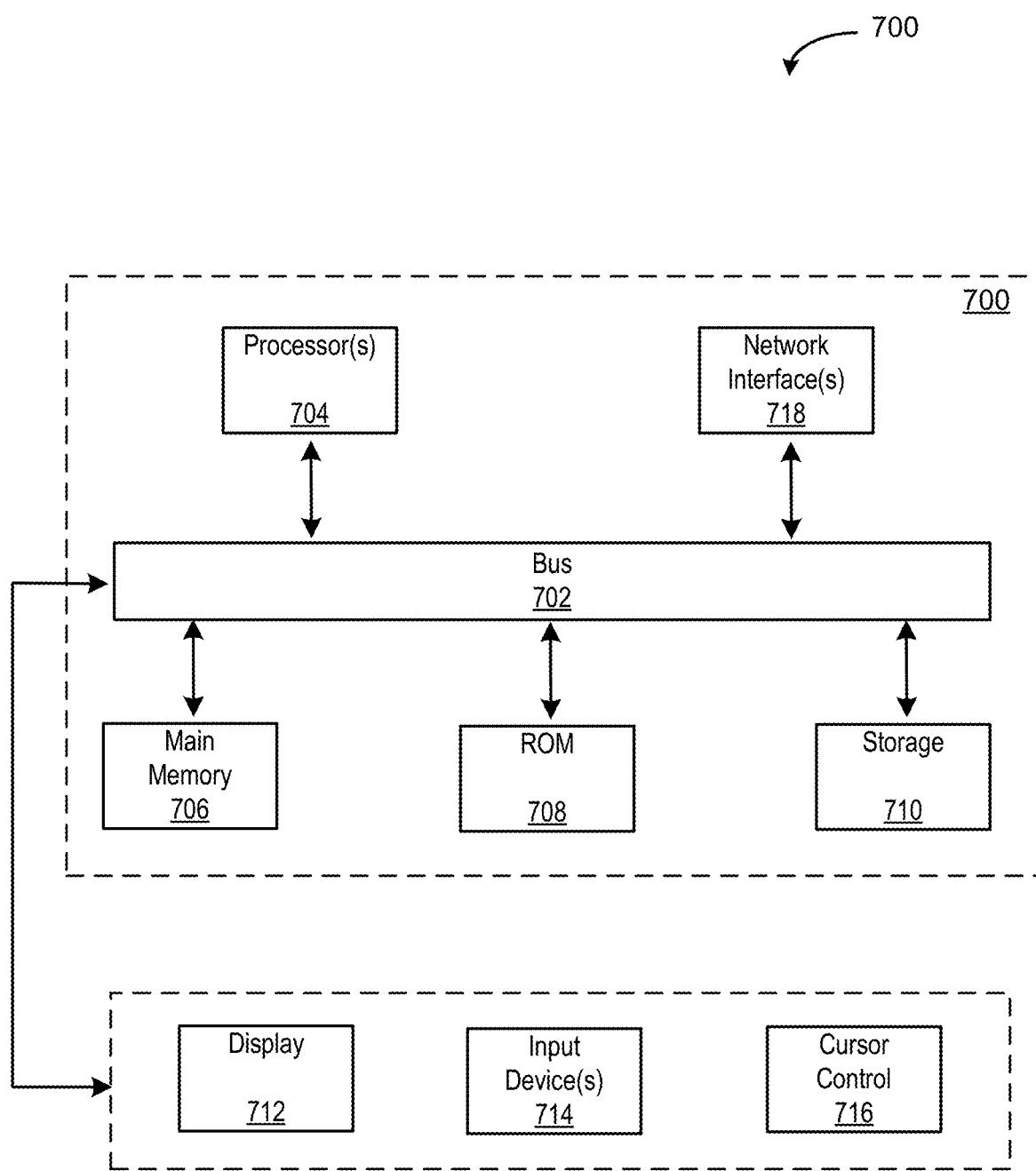
FIG. 7 depicts a block diagram of an example computer system in which embodiments described herein may be implemented.

FIG. 7 depicts a block diagram of an example computer system 700 in which embodiments described herein may be implemented. The computer system 700 includes a bus 702 or other communication mechanism for communicating information, one or more hardware processors 704 coupled with bus 702 for processing information. Hardware processor(s) 704 may be, for example, one or more general purpose microprocessors.

The computer system 700 also includes a main memory 706, such as a random access memory (RAM), cache and/or other dynamic storage devices, coupled to bus 702 for storing information and instructions to be executed by processor 704. Main memory 706 also may be used for storing temporary variables or other intermediate information during execution of instructions to be executed by processor 704. Such instructions, when stored in storage media accessible to processor 704, render computer system 700 into a special-purpose machine that is customized to perform the operations specified in the instructions.

The computer system 700 further includes a read only memory (ROM) 708 or other static storage device coupled to bus 702 for storing static information and instructions for processor 704. A storage device 710, such as a magnetic disk, optical disk, or USB thumb drive (Flash drive), etc., is provided and coupled to bus 702 for storing information and instructions.

The computer system 700 may be coupled via bus 702 to a display 712, such as a liquid crystal display (LCD) (or touch screen), for displaying information to a computer user. An input device 714, including alphanumeric and other keys, is coupled to bus 702 for communicating information and command selections to processor 704. Another type of user input device is cursor control 716, such as a mouse, a trackball, or cursor direction keys for communicating direction information and command selections to processor 704 and for controlling cursor movement on display 712. In some embodiments, the same direction information and command selections as cursor control may be implemented via receiving touches on a touch screen without a cursor.

The computing system 700 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 700 may implement the techniques described herein using customized hard-wired logic, one or more ASICs or FPGAs, firmware and/or program logic which in combination with the computer system causes or programs computer system 700 to be a special-purpose machine. According to one embodiment, the techniques herein are performed by computer system 700 in response to processor(s) 704 executing one or more sequences of one or more instructions contained in main memory 706. Such instructions may be read into main memory 706 from another storage medium, such as storage device 710. Execution of the sequences of instructions contained in main memory 706 causes processor(s) 704 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 710. Volatile media includes dynamic memory, such as main memory 706. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 702. Transmission media can also take the form of acoustic or light waves, such as those generated during radio-wave and infra-red data communications.

The computer system 700 also includes a communication interface 718 coupled to bus 702. Network interface 718 provides a two-way data communication coupling to one or more network links that are connected to one or more local networks. For example, communication interface 718 may be an integrated services digital network (ISDN) card, cable modem, satellite modem, or a modem to provide a data communication connection to a corresponding type of telephone line. As another example, network interface 718 may be a local area network (LAN) card to provide a data communication connection to a compatible LAN (or WAN component to communicated with a WAN). Wireless links may also be implemented. In any such implementation, network interface 718 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 718, which carry the digital data to and from computer system 700, are example forms of transmission media.

The computer system 700 can send messages and receive data, including program code, through the network(s), network link and communication interface 718. In the Internet example, a server might transmit a requested code for an application program through the Internet, the ISP, the local network and the communication interface 718.

The received code may be executed by processor 704 as it is received, and/or stored in storage device 710, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 600.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A network switch, comprising:
    hardware logic for generating a cyclic redundancy check (CRC) code for a received message comprising a sequence of bits, wherein the hardware logic comprises:
        a first group of logic gates representing the sequence of bits in the message;
        a second group of logic gates configured to partition the message into a plurality of partial messages;
        a third group of logic gates configured to concurrently generate a respective partial CRC code for each of the partial messages;
        a fourth group of logic gates configured to weight each partial CRC code according to a position of a corresponding partial message in the message; and
        a fifth group of logic gates configured to sum the weighted partial CRC codes, thereby generating the CRC code for the message; and
    hardware logic for comparing the generated CRC code with a previously calculated CRC code associated with the message to determine whether the received message is corrupted.

2. The network switch of claim 1, wherein the third group of logic gates comprises:
    a sixth group of logic gates configured to divide a partial polynomial representing the partial message by a CRC polynomial, and to obtain a remainder of the dividing.

3. The network switch of claim 1, wherein the fourth group of logic gates is configured to multiply a partial polynomial representing the partial message by a respective weight matrix.

4. The network switch of claim 1, further comprising:
    a sixth group of logic gates configured to exclude a contribution of a leading partial polynomial representing a number of leading bytes from the CRC code by zeroing the weighted partial CRC code corresponding to the leading partial polynomial.

5. The network switch of claim 1, further comprising:
    a sixth group of logic gates configured to exclude a contribution a trailing partial polynomial representing a number of trailing bytes from the CRC code by multiplying the sum of the weighted partial CRC codes by a transform matrix.

6. The network switch of claim 1, wherein:
    the sequence of bits represents a packet of data; and
    the network switch further comprises a sixth group of logic gates configured to append the generated CRC code to the packet of data.

7. The network switch of claim 1, further comprising:
    a sixth group of logic gates configured to convert the generated CRC code to IEEE 802.3 CRC code format.

8. A network switch, comprising:
    a hardware processor; and
    a non-transitory machine-readable storage medium encoded with instructions executable by the hardware processor to perform operations for generating a cyclic redundancy check (CRC) code for a received message comprising a sequence of bits, the operations comprising:
        partitioning the message into a plurality of partial messages,
        concurrently generating a respective partial CRC code for each of the partial messages, weighting each partial CRC code according to a position of respective corresponding partial message in the message, and generating the CRC code for the message by summing the weighted partial CRC codes, and determining whether the message is corrupted by comparing the generated CRC code with a previously calculated CRC code associated with the message.

9. The network switch of claim 8, wherein the generating the respective partial CRC code for each of the partial messages comprises:

dividing a partial polynomial representing the partial message by a CRC polynomial; and taking a remainder of the dividing.

10. The network switch of claim 8, wherein the weighting each partial CRC code according to a position of a corresponding partial message in the message comprises:

multiplying a partial polynomial representing the partial message by a respective weight matrix.

11. The network switch of claim 8, the operations further comprising:

excluding a contribution of a leading partial polynomial representing a number of leading bytes from the CRC code, comprising zeroing the weighted partial CRC codes corresponding to the leading partial polynomial prior to the summing.

12. The network switch of claim 8, the operations further comprising:

multiplying the sum of the weighted partial CRC codes by a transform matrix to exclude a contribution of a trailing partial polynomial representing a number of trailing bytes from the CRC code.

13. The network switch of claim 8, wherein:

the sequence of bits represents a packet of data; and the operations further comprises appending the generated CRC code to the packet of data.

14. The network switch of claim 8, the operations further comprising:

converting the CRC code to IEEE 802.3 CRC code format.

15. A method for generating, by a network switch, a cyclic redundancy check (CRC) code for a message received at the network switch comprising a sequence of bits, the method comprising:

partitioning, by the network switch, the message into a plurality of partial messages;

concurrently generating a respective partial CRC code for each of the partial messages;

weighting each partial CRC code according to a position of a corresponding partial message in the message;

generating the CRC code for the message by summing the weighted partial CRC codes; and determining whether the message is corrupted by comparing the generated CRC code with a previously calculated CRC code associated with the message.

16. The method of claim 15, wherein generating the respective partial CRC code for each of the partial messages comprises:

dividing a partial polynomial representing the partial message by a CRC polynomial; and taking a remainder of the dividing.

17. The method of claim 15, wherein weighting each partial CRC code according to a position of a corresponding partial message in the message comprises:

multiplying a partial polynomial representing the partial message by a respective weight matrix.

18. The method of claim 15, further comprising:

zeroing the weighted partial CRC codes corresponding to one or more leading partial polynomials representing a number of leading bytes prior to the summing to exclude a contribution of the one or more leading partial polynomials from the CRC code.

19. The method of claim 15, further comprising:

multiplying the sum of the weighted partial CRC codes by a transform matrix to exclude a contribution of one or more trailing partial polynomials representing a number of trailing bytes from the CRC code.

20. The method of claim 15, wherein:

the sequence of bits represents a packet of data; and the method further comprises appending the generated CRC code to the packet of data.

* * * * *